United States Patent
Wang et al.

(10) Patent No.: US 7,893,459 B2
(45) Date of Patent: Feb. 22, 2011

(54) SEAL RING STRUCTURES WITH REDUCED MOISTURE-INDUCED RELIABILITY DEGRADATION

(75) Inventors: Chien-Jung Wang, Hsin-Chu (TW); Jian-Hong Lin, Yunlin (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 797 days.

(21) Appl. No.: 11/786,076

(22) Filed: Apr. 10, 2007

(65) Prior Publication Data

US 2008/0251923 A1 Oct. 16, 2008

(51) Int. Cl.
*H01L 29/02* (2006.01)

(52) U.S. Cl. .......... 257/170; 257/208; 257/209; 257/127; 438/140

(58) Field of Classification Search .......... 257/E23.142, 257/758, 618, 774, 751, 765, 762, 529, 208, 257/209, 170, 508, E29.012, E21.646, E29.013, 257/127; 438/140
See application file for complete search history.

(56) References Cited

U.S. PATENT DOCUMENTS

| | | | |
|---|---|---|---|
| 5,652,459 A | 7/1997 | Chen | |
| 5,861,658 A | 1/1999 | Cronin et al. | |
| 5,891,808 A | 4/1999 | Chang et al. | |
| 5,926,697 A | 7/1999 | Yaung et al. | |
| 5,990,537 A * | 11/1999 | Endo et al. | 257/529 |
| 5,994,762 A | 11/1999 | Suwanai et al. | |
| 6,251,786 B1 | 6/2001 | Zhou et al. | |
| 6,255,715 B1 | 7/2001 | Liaw | |
| 6,294,400 B1 | 9/2001 | Stewart et al. | |
| 6,300,223 B1 | 10/2001 | Chang et al. | |
| 6,313,900 B1 | 11/2001 | Kawata | |
| 6,376,899 B1 | 4/2002 | Seshan et al. | |
| 6,424,051 B1 | 7/2002 | Shinogi et al. | |
| 6,451,681 B1 | 9/2002 | Greer | |
| 6,492,716 B1 * | 12/2002 | Bothra et al. | 257/678 |
| 6,525,398 B1 | 2/2003 | Kim et al. | |
| 6,537,849 B1 | 3/2003 | Tsai et al. | |
| 6,566,736 B1 | 5/2003 | Ogawa et al. | |
| 6,573,538 B2 | 6/2003 | Motsiff et al. | |
| 6,617,664 B2 | 9/2003 | Hayashi et al. | |
| 6,753,608 B2 | 6/2004 | Tomita | |
| 7,253,487 B2 * | 8/2007 | Chen | 257/409 |
| 7,466,284 B2 * | 12/2008 | Barry | 343/867 |
| 7,607,586 B2 * | 10/2009 | Wang | 235/492 |
| 2004/0150070 A1 * | 8/2004 | Okada et al. | 257/508 |

* cited by examiner

*Primary Examiner*—Thao X Le
*Assistant Examiner*—Thanh Y Tran
(74) *Attorney, Agent, or Firm*—Slater & Matsil, L.L.P.

(57) ABSTRACT

A semiconductor chip includes a seal ring adjacent to edges of the semiconductor chip; an opening extending from a top surface to a bottom surface of the seal ring, wherein the opening has a first end on an outer side of the seal ring and a second end on an inner side of the seal ring; and a moisture barrier having a sidewall parallel to a nearest side of the seal ring, wherein the moisture barrier is adjacent the seal ring and has a portion facing the opening.

15 Claims, 9 Drawing Sheets

SEAL RING STRUCTURES WITH REDUCED MOISTURE-INDUCED RELIABILITY DEGRADATION

TECHNICAL FIELD

This invention relates to the manufacture of semiconductor chips having seal rings, and more particularly to structures and methods for preventing moisture penetration through seal rings.

BACKGROUND

Seal ring formation is an important part in the back-end of semiconductor processes. Seal rings are stress protection structures around integrated circuits, protecting the internal circuit inside semiconductor chips from damage caused by the dicing of the semiconductor chips from wafers.

A typical seal ring is formed of interconnected metal lines and connecting vias. FIG. 1 is a schematic view of a part of seal ring 10. Seal ring 10 is typically formed on an inner side of dicing line 12, sometimes also referred to as a scribe line. Typically, there is a circuit region (not shown) on the left-hand side of the drawing and a dicing region (a region to be cut during dicing) on the right-hand side of the drawing.

Seal ring 10 includes interconnected metal components, which are formed of metal lines 14 and conductive vias 18, both formed in dielectric layers 16. Metal lines 14 and vias 18 are physically connected. Moreover, a passivation film 20 is formed over a top layer of seal ring 10.

Because of the provision of seal ring 10 and passivation film 20, the circuit region on the inner side of seal ring 10 is protected from influences of external environments, thus it is possible to ensure stability of properties of the semiconductor device over a long period of time. Typically, seal rings are electrically floating and do not provide electrical protection.

A further function of seal ring 10 is to protect the integrated circuits on the inner side of seal ring from moisture-induced degradation. Since dielectric layers 16 are typically formed of porous low-k dielectric materials, moisture can easily penetrate through low-k dielectric layer 16 to reach the integrated circuits. Since seal ring 10, which is formed of metal, blocks the moisture penetration path, the moisture penetration is significantly reduced.

To accommodate the ever-evolving requirement of customized applications, the design of seal rings needs to be customized. A customized design of the seal rings is introduced in the present invention.

SUMMARY OF THE INVENTION

In accordance with one aspect of the present invention, a semiconductor chip includes a seal ring adjacent to edges of the semiconductor chip; an opening extending from a top surface to a bottom surface of the seal ring, wherein the opening has a first end on an outer side of the seal ring and a second end on an inner side of the seal ring; and a moisture barrier having a sidewall parallel to a nearest side of the seal ring, wherein the moisture barrier is adjacent the seal ring and has a portion facing the opening.

In accordance with another aspect of the present invention, an integrated circuit structure includes a semiconductor chip; and a seal ring comprising a first, a second, a third and a fourth sides, each adjacent to an edge of the semiconductor chip, wherein the first, the second, the third and the fourth sides are interconnected to each other. The seal ring includes a plurality of metal lines each in one of a plurality of dielectric layers; a plurality of via bars connecting the plurality of metal lines; and an opening extending through the plurality of metal lines and the plurality of via bars, wherein the opening spaces a first end and a second end of the seal ring apart. The grated circuit structure further includes a barrier comprising a plurality of metal lines and connecting vias in the plurality of dielectric layers, wherein the barrier is adjacent to and faces the opening, and wherein the barrier is connected to at most one of the first and the second ends of the seal ring.

In accordance with yet another aspect of the present invention, a semiconductor chip includes a first seal ring and a second seal ring adjacent to edges of the semiconductor chip. A first opening is formed in the first seal ring, wherein the first opening extends from a top layer to a bottom layer of the first seal ring and breaks a loop of the first seal ring. A second opening is formed in the second seal ring, wherein the second opening extends from a top layer to a bottom layer of the second seal ring and breaks a loop of the second seal ring. The first opening misaligns to the second opening.

The advantageous features of the present invention include broken seal rings for reducing noise coupling, and reducing moisture penetration by extending moisture-traveling paths and/or the formation of a moisture barrier.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
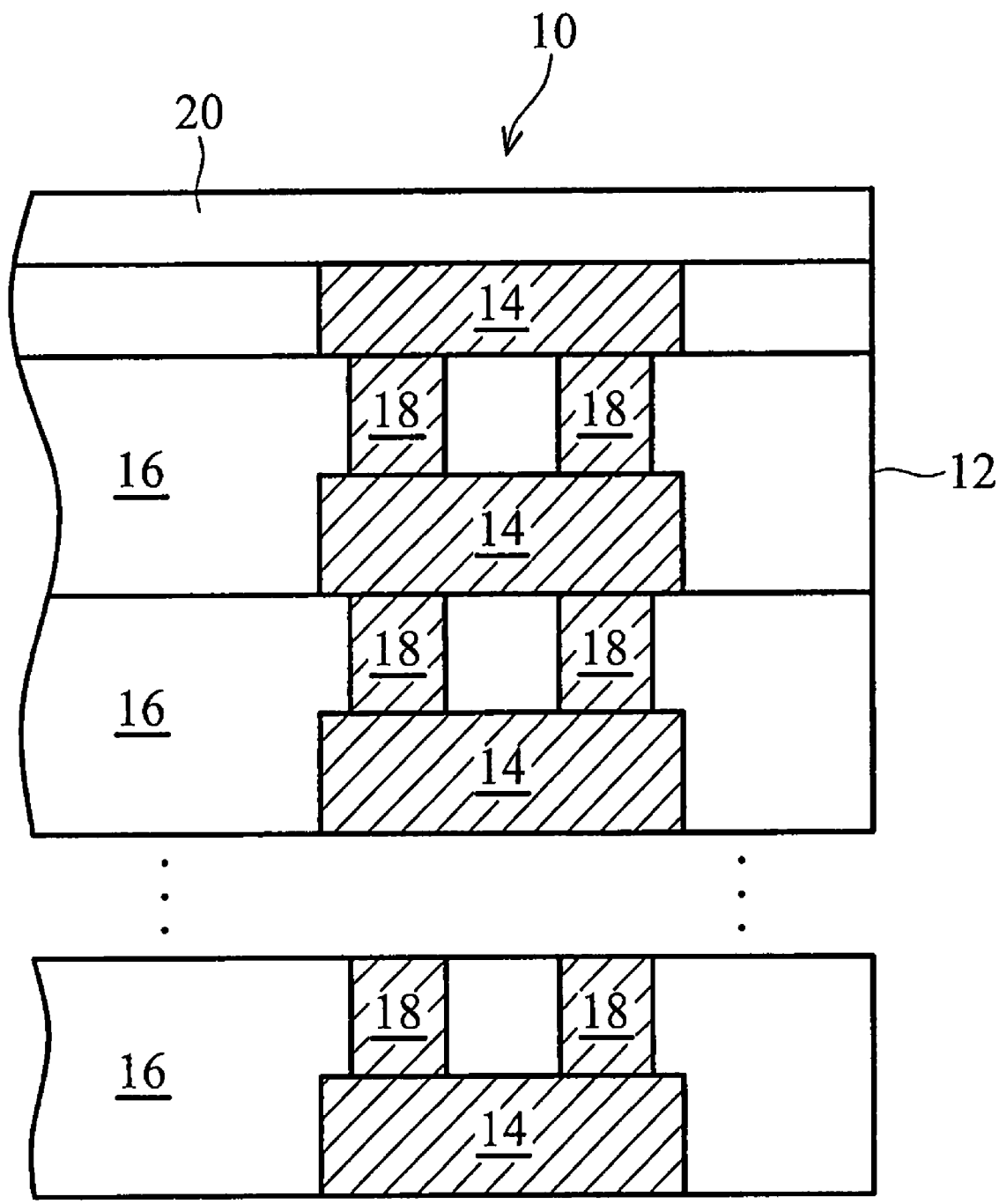
FIG. 1 illustrates a conventional seal ring.
Figure 2:
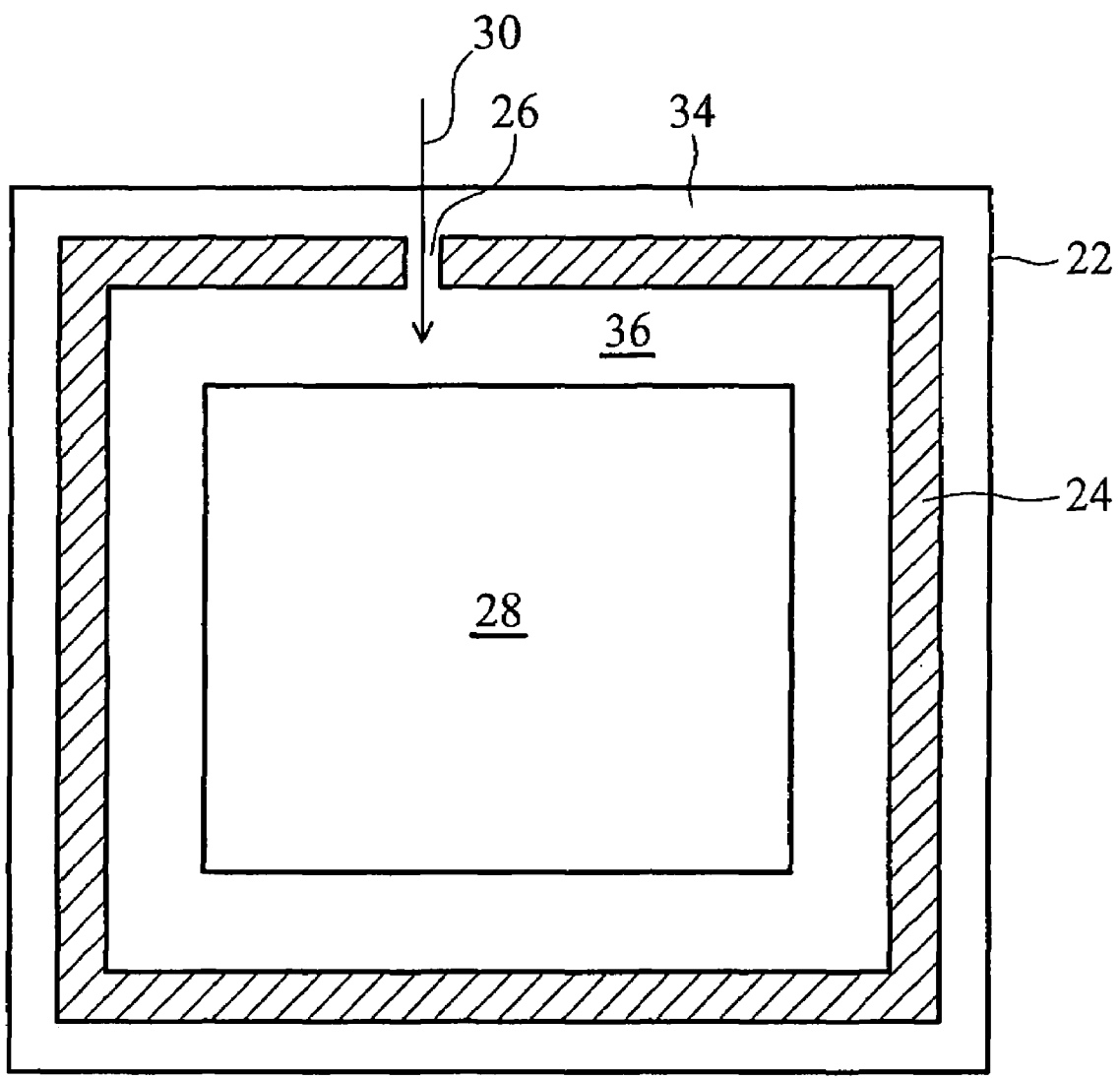
FIG. 2 schematically illustrates a top view of an embodiment of the present invention, wherein a seal ring includes an opening.

FIG. 2 illustrates a top view of semiconductor chip 22, which includes seal ring 24 formed adjacent to the edges of semiconductor chip 22. Integrated circuit 28 is formed on an inner side 36 of seal ring 24. While not shown in the top view, integrated circuit 28 may be formed at the surface of a semiconductor substrate (not shown) in semiconductor chip 22. Seal ring 24, on the other hand, is formed in the metallization layers overlying the semiconductor substrate.

Opening 26 breaks the loop of seal ring 24. Advantageously, the broken seal ring 24 results in the break of a noise-coupling path, which noise may be formed in an otherwise closed-loop seal ring. The breaking of noise is particularly advantageous for isolating integrated circuits from noises generated by high-frequency circuits, for example, radio-frequency (RF) circuits. In a first embodiment, integrated circuit 28 includes a high-frequency circuit, which may undesirably affect the integrated circuits external to semiconductor chip 22. In a second embodiment, the high-frequency circuit is external to semiconductor chip 22, and thus integrated circuit 28 needs to be protected from the noise coupling. Since seal ring 24 includes a plurality of metallization layers connected by vias or via bars, opening 26 extends all the way from the top layer to the bottom layer of seal ring 24.

The breaking of seal ring 24, however, causes the moisture prevention function of seal ring 24 to be degraded. Since seal ring 24 is formed in dielectric layers (not shown), which preferably have low dielectric constants, for example, less than about 3.5, moisture may penetrate into semiconductor chip 22 from its edges to the outer side 34 of seal ring 24, and then reach the inner side 36, hence integrated circuit 28, through opening 26. Accordingly, moisture-induced reliability degradation occurs to integrated circuit 28. In the illustrated example, the moisture may penetrate along a path symbolized by arrow 30.

Figure 3A:
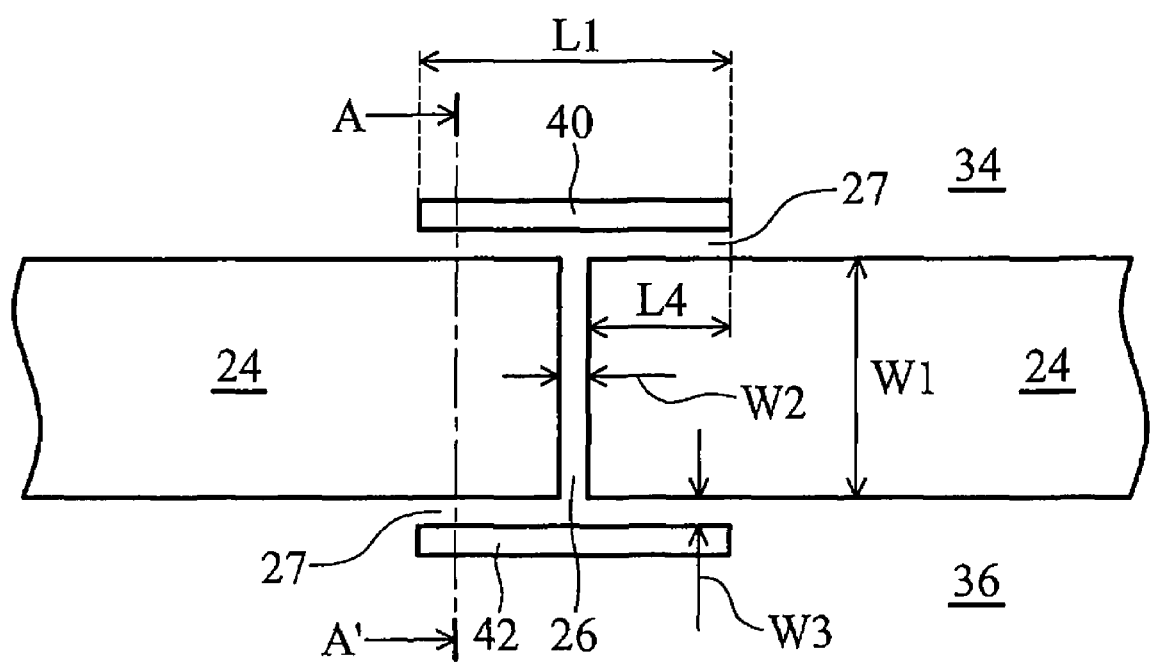
FIGS. 3A and 3B illustrate a top view and a cross-sectional view of an embodiment of the present invention, respectively, wherein moisture barriers are formed adjacent an opening in a seal ring.

In the embodiments of the present invention, moisture penetration is reduced by extending the moisture-traveling path, and/or narrowing the moisture-traveling path. FIG. 3A illustrates a top view of an embodiment. For simplicity, only a portion of seal ring 24 that includes opening 26 is illustrated. To narrow the moisture-traveling path, width W2 of opening 26 is preferably small. In an embodiment, width W2 of opening 26 is less than about 0.8 µm, and more preferably less than about 0.2 µm. In alternative embodiments, width W2 is less than about 80 percent, and more preferably less than about 10 percent, of width W1 of seal ring 24. In yet other embodiments, width W2 is the minimum width allowed by the formation technology.

In the preferred embodiment, the increase in the moisture-traveling path is achieved by forming moisture barriers, as shown in FIGS. 3A through 5. Referring to FIG. 3A, moisture barrier 40 is formed on a side of seal ring 24. Preferably, moisture barrier 40 comprises the same metal as, and is formed simultaneously with the formation of, seal ring 24. In a more preferred embodiment, an additional moisture barrier 42 is formed on an opposite side of seal ring 24 than moisture barrier 40. In order to reach integrated circuit 28, which is on inner side 36 of seal ring 24, moisture has to trace through the opening(s) connecting outer side 34 and inner side 36, which openings include opening 26. Therefore, assuming moisture barriers 40 and 42 each have a half on the left side, and a half on the right side, of opening 26, the moisture-traveling length is increased to L1+W1. Preferably, the distance W3 between moisture barriers 40 and 42 and seal ring 24 is small, with essentially the same specification as width W2. Accordingly, in an exemplary embodiment, width W2 of opening 26 and distance W3 are comparable.

Figure 3B:
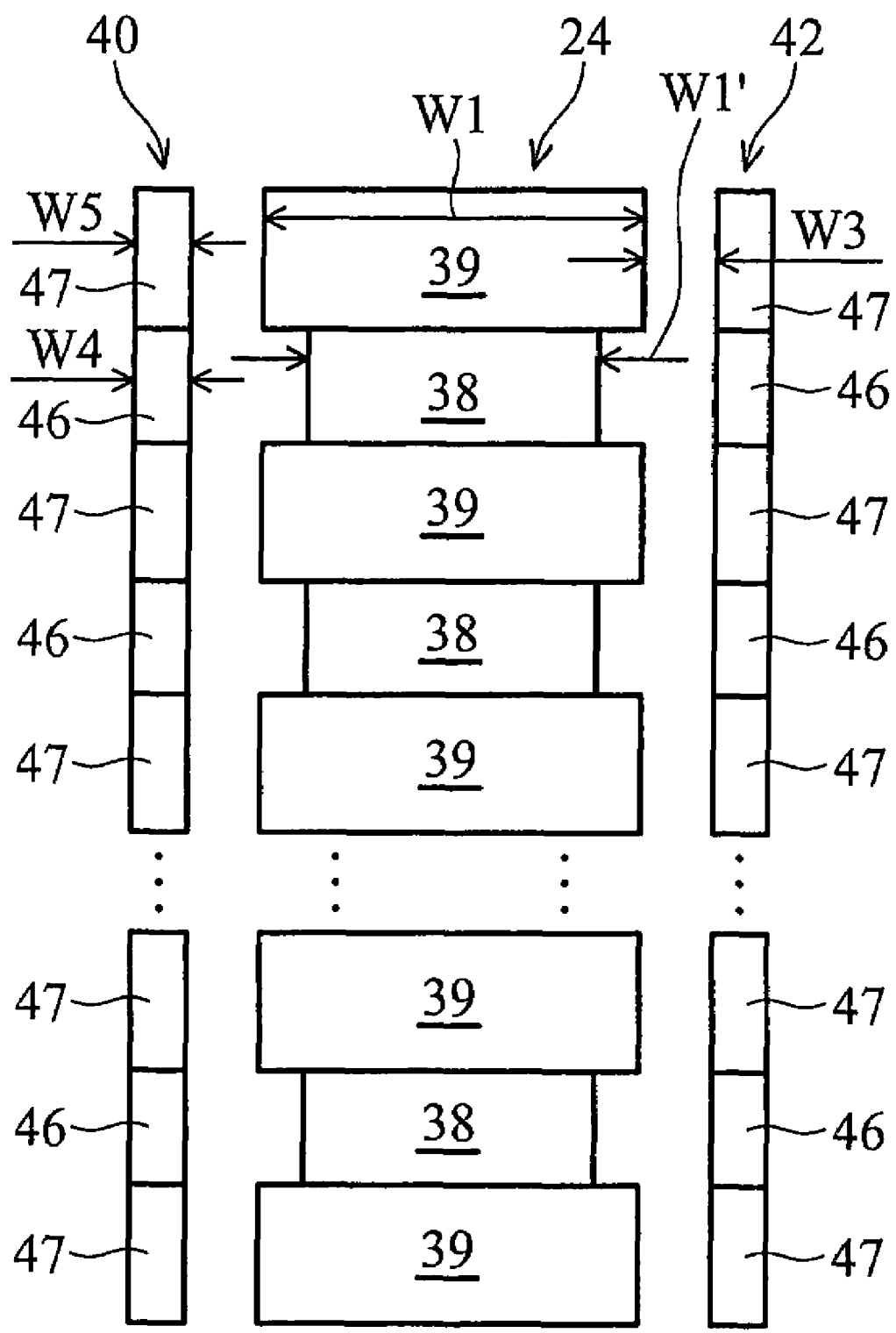

A cross-sectional view of the embodiment shown in FIG. 3A is illustrated in FIG. 3B, wherein the cross-sectional view is taken along a plane crossing line A-A'. FIG. 3B shows that moisture barriers 40 and 42 extend across all of the metallization layers in which seal ring 24 is formed. Each of the moisture barriers 40 and 42 includes via portions 46 and metal line portions 47, wherein via portions 46 are formed to connect the respective metal line portions 47 in different metallization layers. Via portions 46 are preferably continuous via bars. To have a good moisture-blocking ability, via portions 46 preferably have width W4 close to width W5 of metal line portions 47. In an exemplary embodiment, W4 equals width W5. As a result, moisture barriers 40 and 42 are each an integrated plate extending from the top layer to the bottom layer of seal ring 24. Similarly, seal ring 24 includes via portions 38 and metal line portions 39. Each of the via portions 38 and metal line portions 39 preferably form nearly a loop, except the loop is broken by opening 26 (refer to FIGS. 2 and 3A). To achieve optimum moisture-blocking effects, width W1' of vias bars 38 is preferably equal to width W1 of metal lines 39.

Figure 4:
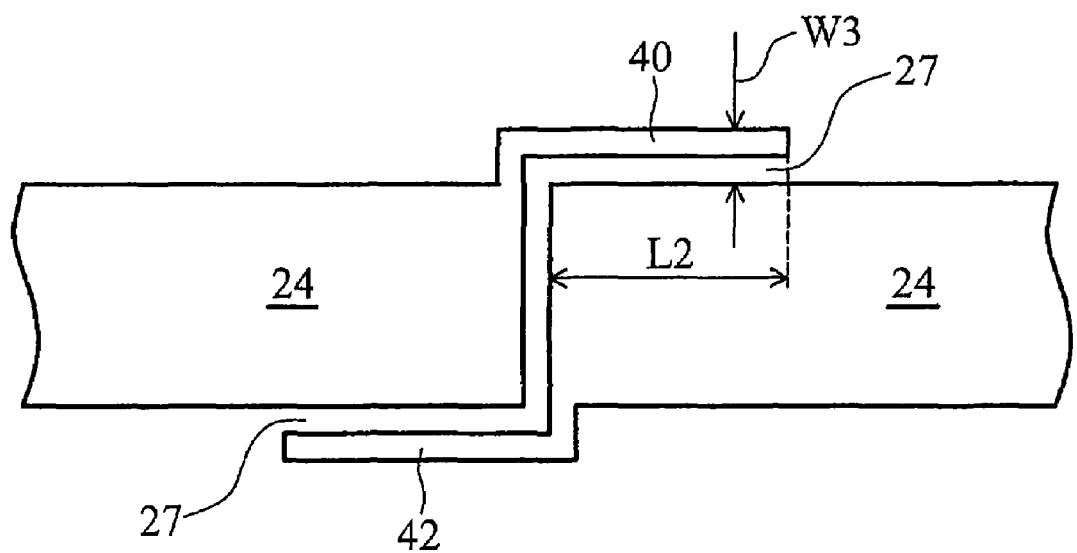
FIGS. 4 through 5 illustrate variations of moisture barriers.
Figure 5:
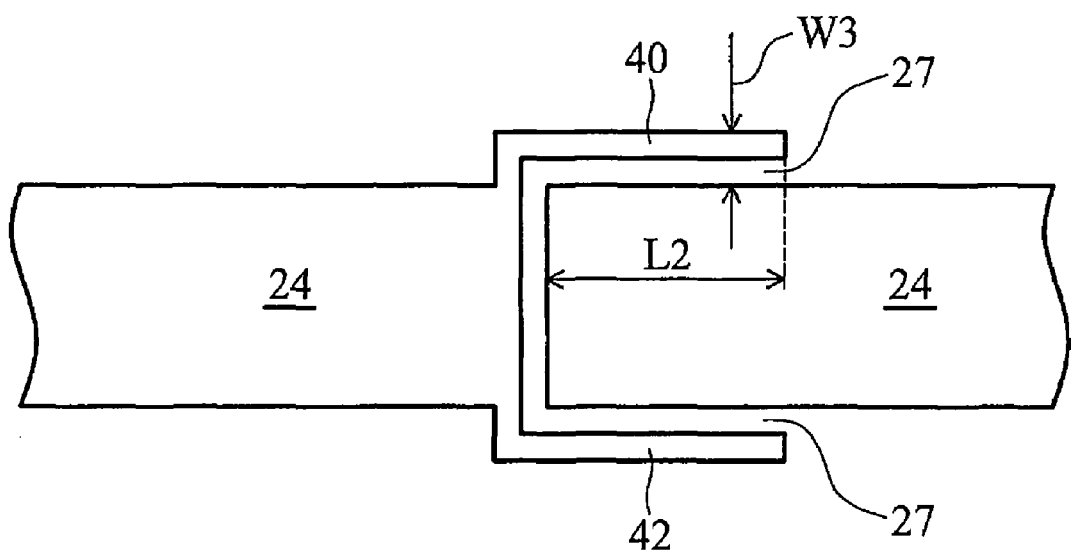

In FIG. 4, one end of moisture barrier 40 is connected to one end of seal ring 24, and one end of moisture barrier 42 is connected to the other end of seal ring 24. As a result, the moisture-traveling path is further increased. FIG. 5 illustrates an alternative embodiment, wherein both moisture barriers 40 and 42 are connected to a same end of the broken seal ring 24.

In each of the embodiments shown in FIGS. 3A through 5, the additional moisture-traveling paths added by the formation of moisture barriers 40 and 42 preferably have significantly greater lengths L2 than width W3. In an exemplary embodiment, a ratio of L2 to W3 is preferably greater than about 2, and more preferably between about 20 and about 100.

Figure 6A:
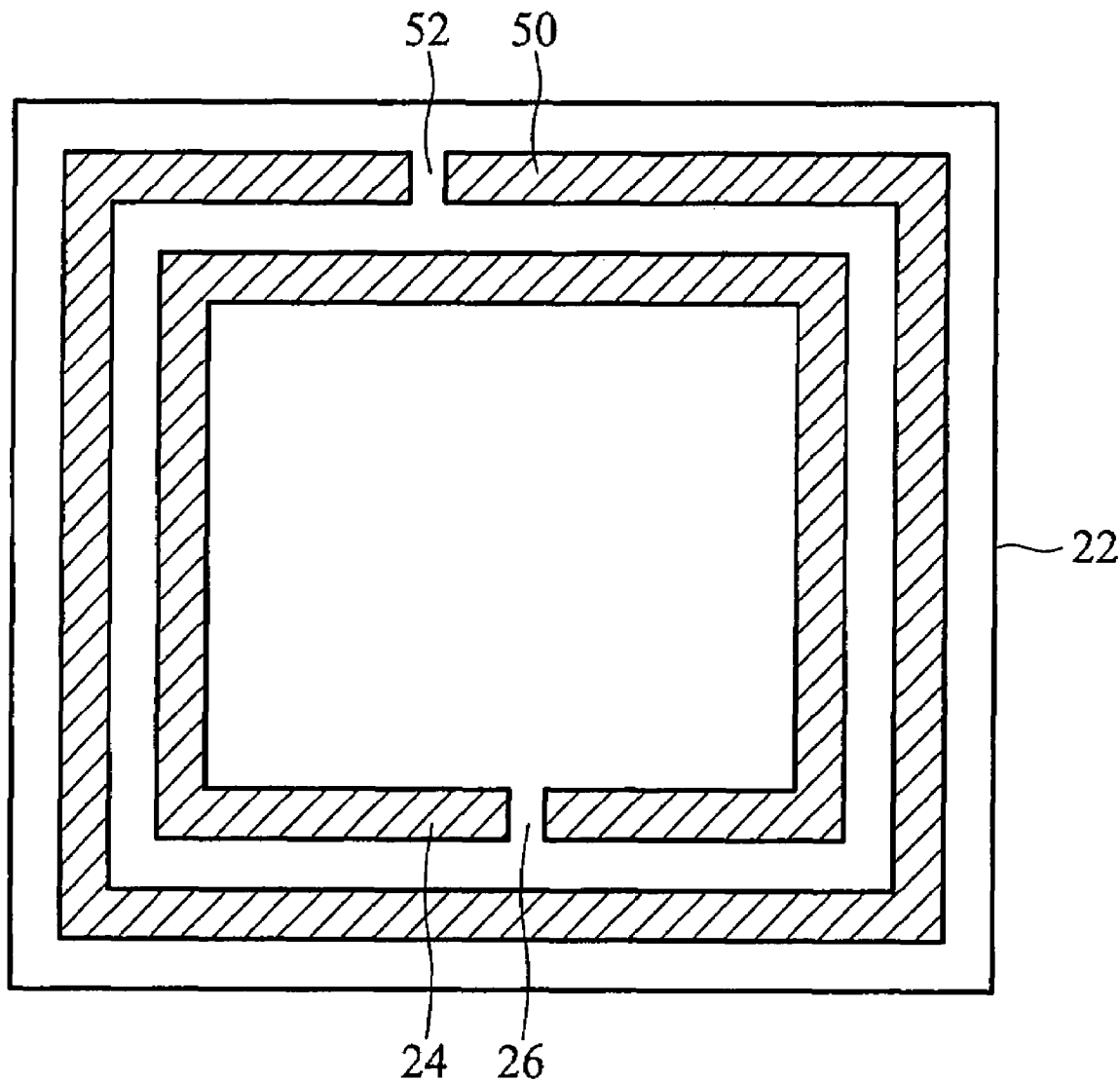
FIGS. 6A through 7B are top views of embodiments having two seal rings, wherein each of the seal rings includes an opening.

FIG. 6A illustrates yet other embodiments for reducing moisture penetration. An additional seal ring 50, often referred to as sacrificial seal ring 50, is formed between seal ring 24 and the edges of semiconductor chip 22. Sacrificial seal ring 50 further includes opening 52. Preferably, opening 26 is misaligned to opening 52, so that the moisture penetrating through sacrificial seal ring 50 has to travel a great distance before it reaches opening 26. The moisture penetration is thus reduced. In an embodiment, openings 26 and 52 face different edges of semiconductor chip 22, as shown in FIG. 6A. Alternatively, openings 26 and 52 face a same edge of semiconductor chip 22, but are spaced far enough apart from each other. For example, openings 26 and 52 may be adjacent to different corners, as is shown in FIG. 6B.

Figure 6B:
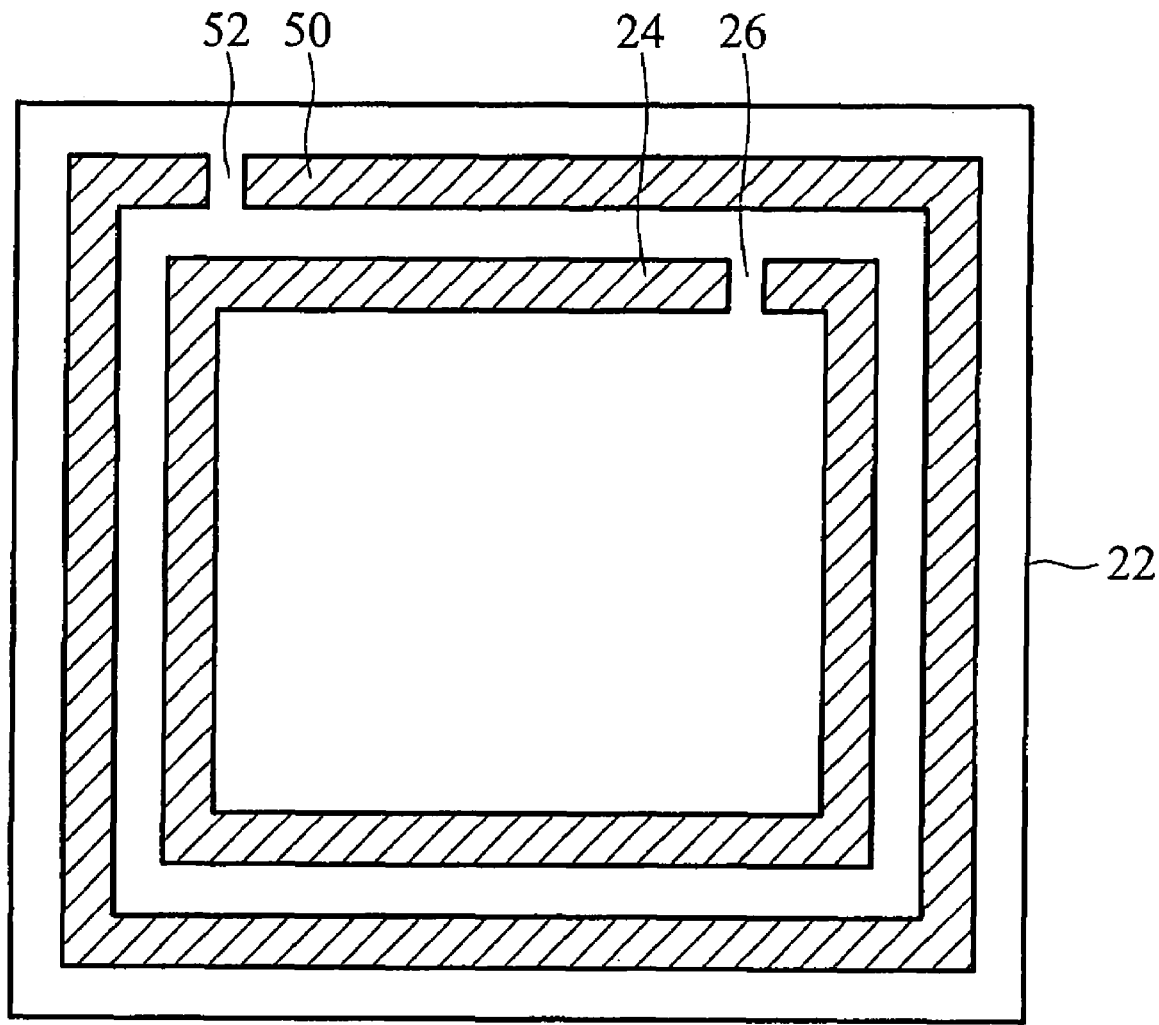
Figure 7A:
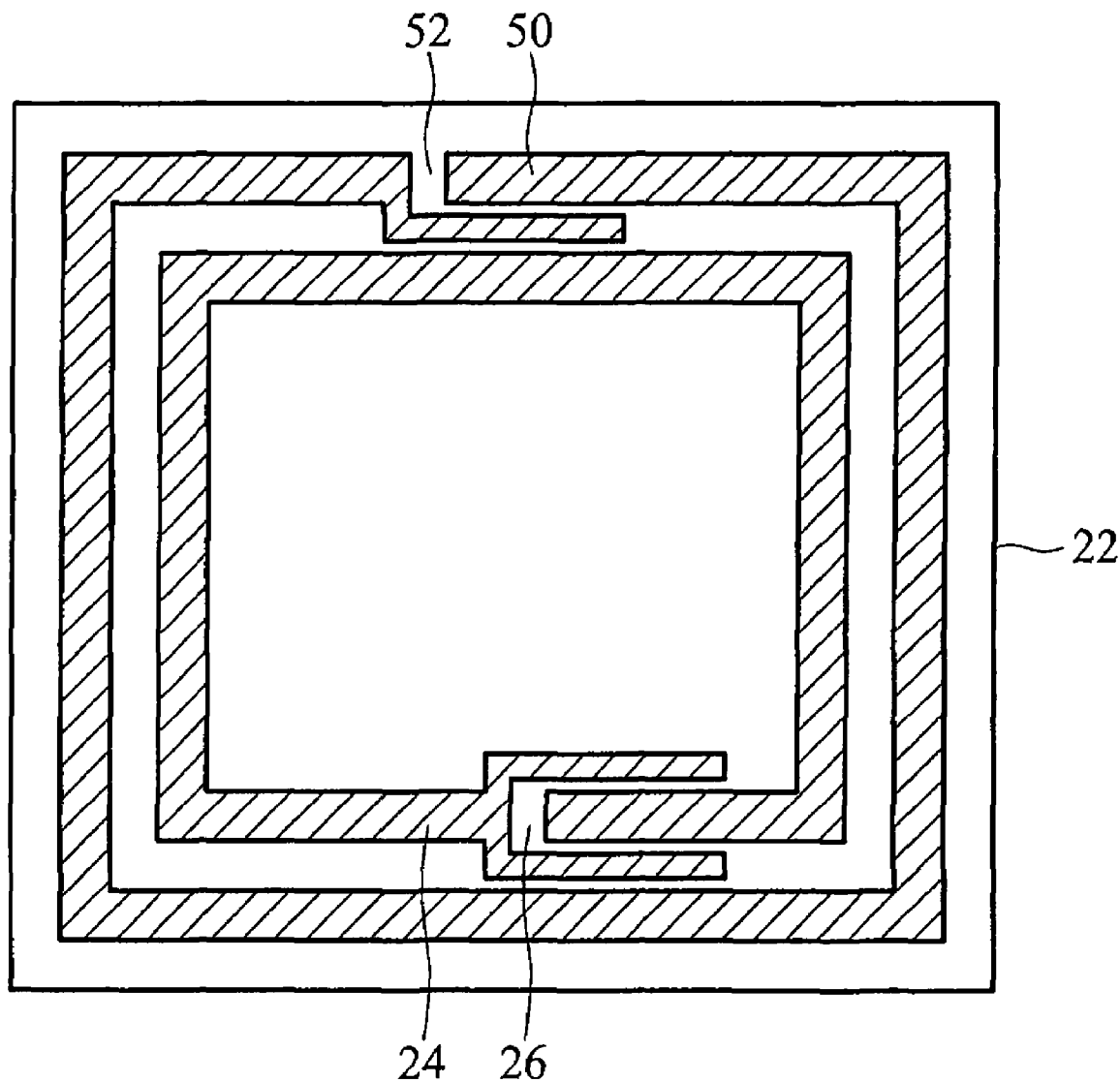
Figure 7B:
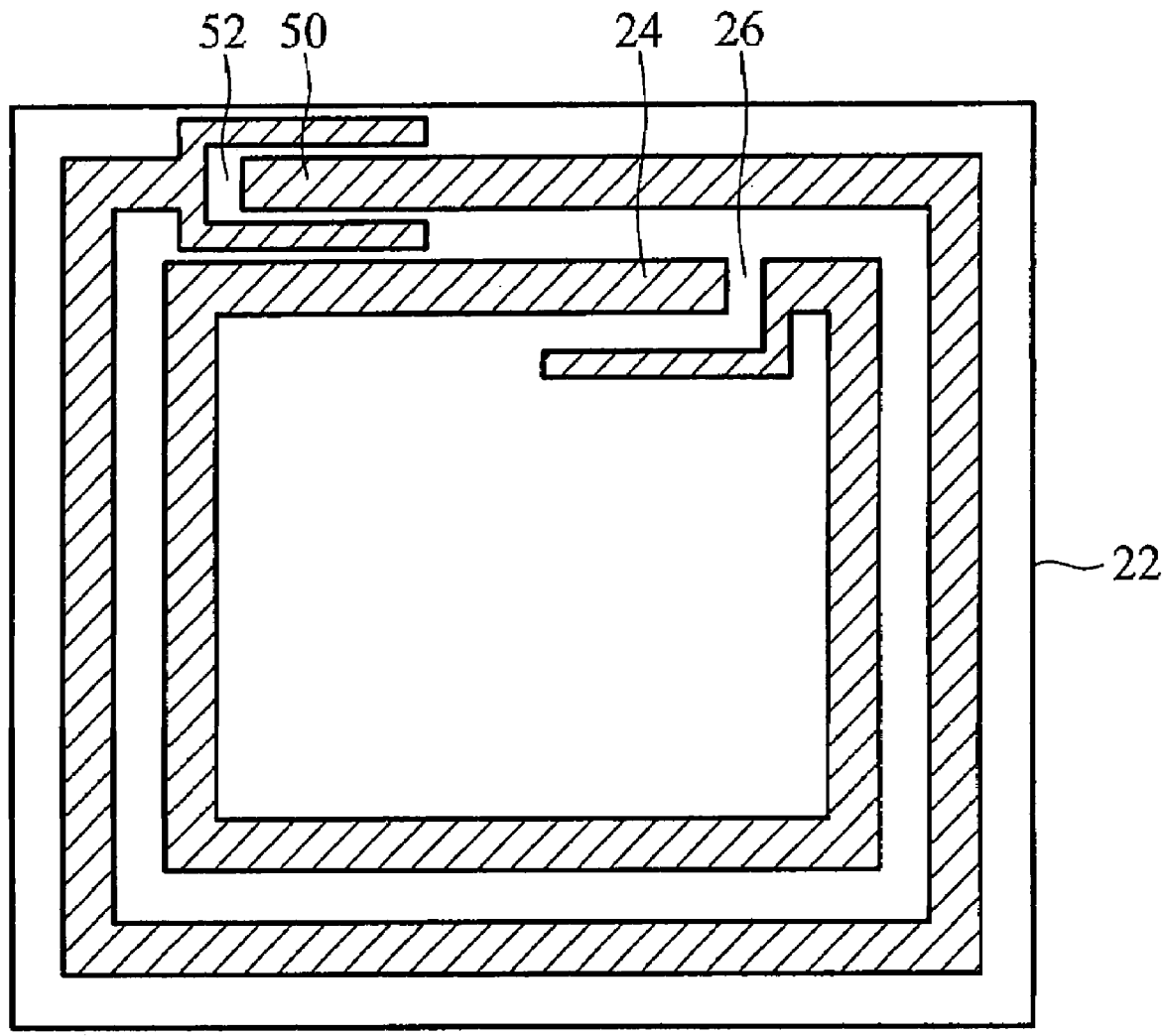

Furthermore, the moisture-traveling length of each of the openings 26 and 52 as shown in FIGS. 6A and 6B may be extended by applying the concept showing in FIGS. 3A through 5. One skilled in the art will realize the implementation details. Exemplary embodiments are shown in FIGS. 7A and 7B.

With broken seal rings, the noise-coupling paths in the seal rings are broken. Increasing the moisture-traveling path may reduce the adverse increase in moisture penetration caused by the openings in the seal rings. The degradation to the reliability of the integrated circuits is thus reduced. Advantageously, the embodiments of the present invention do not introduce any additional cost.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor chip comprising:
a seal ring adjacent to edges of the semiconductor chip;
an opening extending from a top surface to a bottom surface of the seal ring, wherein the opening has a first end on an outer side of the seal ring and a second end on an inner side of the seal ring; and
a moisture barrier having a sidewall parallel to a nearest side of the seal ring, wherein the moisture barrier is adjacent the seal ring and has a portion facing the opening, wherein the, opening separates the seal ring into a first terminal and a second terminal, and wherein the moisture barrier is connected to only one of the first and the second terminals of the seal ring.

2. The semiconductor chip of claim 1, wherein the opening and the moisture barrier have a distance comparable to a width of the opening.

3. The semiconductor chip of claim 1, wherein the moisture barrier comprises a same material and extends through same metallization layers as the seal ring.

4. The semiconductor chip of claim 3, wherein the moisture barrier is a plate having no openings therein.

5. The semiconductor chip of claim 1 further comprising an additional moisture barrier adjacent the opening and on an opposite side of the seal ring than the moisture barrier.

6. The semiconductor chip of claim 1, wherein the moisture barrier comprises an additional seal ring adjacent to the edges of the semiconductor chip, wherein the additional seal ring comprises an additional opening, and wherein the opening of the seal ring and the additional opening of the additional seal ring are misaligned.

7. The semiconductor chip of claim 1, wherein the opening has a width of less than about 2 μm.

8. The semiconductor chip of claim 1, wherein the seal ring and the moisture barrier are not overlapped in a vertical direction perpendicular to a major surface of the semiconductor chip.

9. The semiconductor chip of claim 1, wherein the seal ring comprises a first plurality of metal lines in a plurality of metallization layers, with the plurality of metal lines vertically overlapped and connected through vias, and wherein the moisture barrier comprises a second plurality of metal lines in the plurality of metallization layers.

10. An integrated circuit structure comprising:
a semiconductor chip;
a seal ring comprising a first, a second, a third and a fourth side each adjacent to an edge of the semiconductor chip, wherein the first, the second, the third and the fourth sides are interconnected to each other, and wherein the seal ring comprises:
a first plurality of metal lines each in one of a plurality of dielectric layers;
a plurality of via bars connecting the first plurality of metal lines; and
an opening extending through the first plurality of metal lines and the plurality of via bars, wherein the opening spaces a first end and a second end of the seal ring apart; and
a barrier comprising a second plurality of metal lines and connecting vias in the plurality of dielectric layers, wherein the barrier is adjacent to and faces the opening, and wherein the barrier is connected to one of, and is not connected to another one of, the first and the second ends of the seal ring.

11. The integrated circuit structure of claim 10, wherein the plurality of dielectric layers comprises low-k dielectric materials.

12. The integrated circuit structure of claim 10, wherein the barrier is a plate comprising same materials as the seal ring, and wherein the plate comprises no openings therein.

13. The integrated circuit structure of claim 12, wherein the via bars and the metal lines of the seal ring have a same width, and wherein the second plurality of metal lines and the connecting vias of the barrier have a same width.

14. The integrated circuit structure of claim 10, wherein a path defined by the barrier and the seal ring has a length and a width, and wherein a ratio of the length to the width is greater than about 20.

15. The integrated circuit structure of claim 10, wherein the seal ring and the barrier are not overlapped in a vertical direction perpendicular to a major surface of the semiconductor chip.

* * * * *